United States Patent [19]

Orban

[11] Patent Number: 5,050,217

[45] Date of Patent: Sep. 17, 1991

[54] DYNAMIC NOISE REDUCTION AND SPECTRAL RESTORATION SYSTEM

[75] Inventor: Robert A. Orban, Belmont, Calif.

[73] Assignee: AKG Acoustics, Inc., Stamford, Conn.

[21] Appl. No.: 482,063

[22] Filed: Feb. 16, 1990

[51] Int. Cl.$^5$ .......................................... H04B 15/00
[52] U.S. Cl. .................................... 381/94; 381/106; 381/98; 333/14; 333/28 T
[58] Field of Search ................... 381/94, 106, 98; 333/28 T, 14

[56] References Cited

U.S. PATENT DOCUMENTS

| | | | |
|---|---|---|---|
| 4,562,591 | 12/1985 | Stikvoort | 381/106 |
| 4,609,878 | 9/1986 | Rodgers | 381/94 |
| 4,696,044 | 9/1987 | Waller, Jr. | 381/106 |
| 4,704,726 | 11/1987 | Gibson | 381/106 |
| 4,953,216 | 8/1990 | Beer | 381/94 |

Primary Examiner—Forester W. Isen
Attorney, Agent, or Firm—Blakely, Sokoloff, Taylor & Zafman

[57] ABSTRACT

An audio processor consisting of a "single-ended" dynamic noise reduction system cascaded and cross-coupled with a program-adaptive dynamic equalizer. The audio at the output has a consistent subjective spectral texture even if the spectral texture of the input audio varies widely. Further, although the system often adds high frquency energy to the audio, it does not increase the perceived noise level and is free from audible noise modulation.

11 Claims, 2 Drawing Sheets

DYNAMIC NOISE REDUCTION AND SPECTRAL RESTORATION SYSTEM

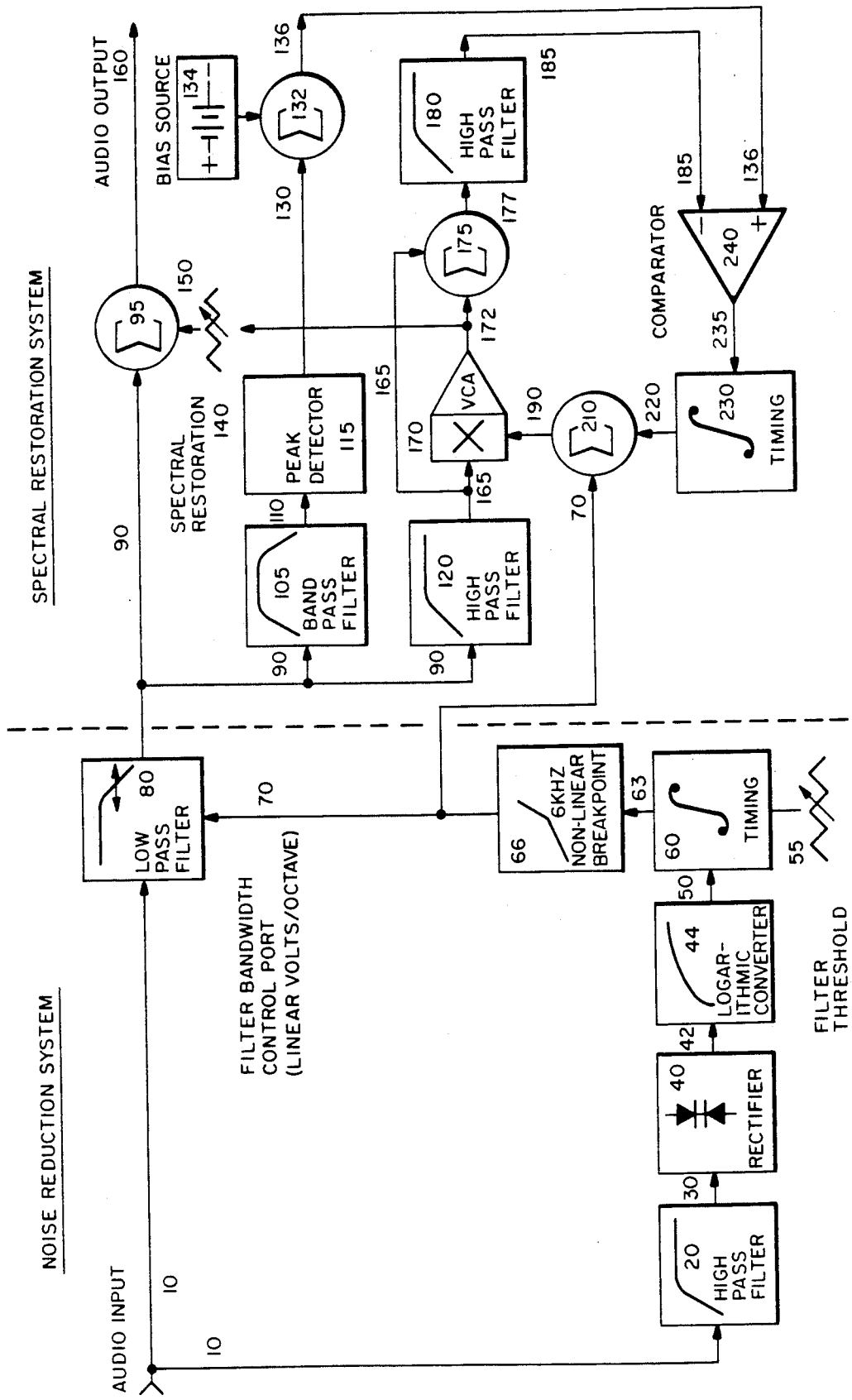

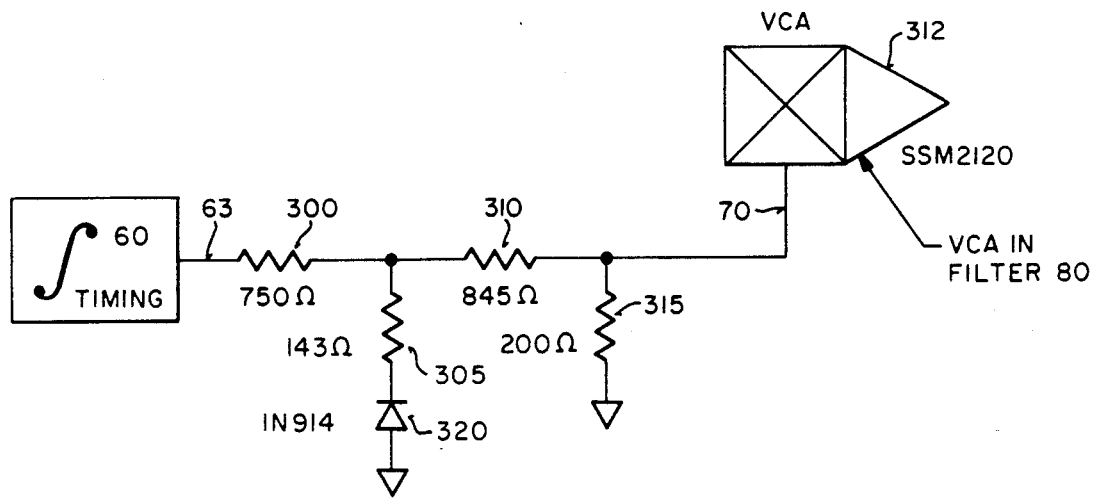
FIG_2
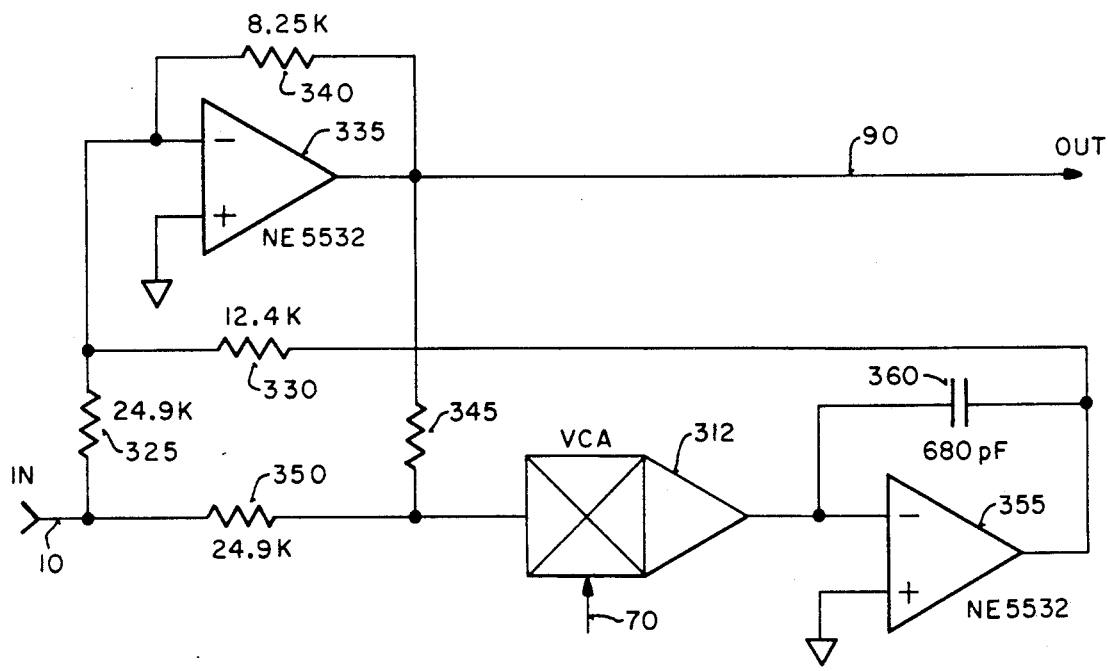
FIG_3

DYNAMIC NOISE REDUCTION AND SPECTRAL RESTORATION SYSTEM

BACKGROUND OF THE INVENTION

1. Field of the Invention

The invention relates to the field of audio signal processing.

2. Prior Art

Two of the most common maladies afflicting audio signals are excessive noise and insufficient high-frequency energy. There have been many efforts to eliminate noise by applying the signal to a lowpass filter whose bandwidth is controlled by the high-frequency content of the program material. When the program contains large amounts of high frequency energy, the filter's bandwidth opens because this high frequency energy psychoacoustically masks the noise. When the program contains little high frequency energy, the bandwidth of the filter decreases to reduce audible noise. U.S. Pat. Nos. 4,609,878 and 4,696,044 contain a good list of references on this subject.

The classic problems of single-ended dynamic noise reduction systems are (1) the noise level is audibly modulated by the program; and, if the threshold of bandwidth expansion is set high enough to prevent such noise modulation, (2) the program sounds dull because the filter removes more desired high frequency program energy than necessary to eliminate noise modulation. The present invention attacks both these problems in novel ways.

Applicant believes the earliest commercial effort to automatically equalize an audio signal to ensure good quality at all times was the CBS Laboratories "Dynamic Presence Equalizer". This system uses a ratio circuit to determine the ratio between the energy in the midrange frequencies and the total program energy. If the relative energy in the midrange was determined by the ratio circuit to be either excessive or insufficient, the system automatically cut or boosted these frequencies (with an equalizer) to correct the situation.

This system has at least one problem: if the input signal lacked high frequency energy but was nevertheless somewhat noisy, the dynamic presence equalizer would boost the midrange, and with it, the noise. The present invention eliminates this unnatural-sounding artifact. A further problem is that the system requires an analog divider to obtain the ratio. Analog dividers are expensive. The present invention achieves a similar goal with less expensive hardware.

The invention uses a noise reduction system having the general components shown in U.S. Pat. No. 4,696,044. There are, however, significant difference, for example, two of these components are interchanged, changing the characteristics of this prior art system. Specifically, the "log convert" and "absolute value" blocks are interchanged. This changes the dynamic response of the noise reduction system used as part of the present invention. Moreover, as will be seen, the present invention uses a "breakpoint" in controlling bandwidth.

SUMMARY OF THE INVENTION

A dynamic, program-controlled shelving filter (with a dominant lowpass characteristic) for noise reduction used in series with a program-controlled dynamic high-frequency equalizer is disclosed. (The dynamic high-frequency equalizer is sometimes referred to as the "spectral restoration" system or circuit.) A novel aspect of the noise reduction system or circuit as used in the present invention is the use of a nonlinear element (the non-linear breakpoint circuit 66 of FIG. 1 of the present invention) prior to the bandwidth control port in the lowpass filter 80. This lowpass filter's bandwidth in octaves is linearly proportional to its control signal. This non-linear element causes the constant of proportionality to increase four-fold when the bandwidth of the filter exceeds 6 kHz, thereby causing the bandwidth of the filter to increase very rapidly thereafter. Once the filter reaches 6 kHz, the bandwidth then virtually "jumps" to beyond 20 kHz, at which point the effect of the filter is essentially undetectable to the ear. This exploits the psychoacoustical fact that the sensitivity of the ear to noise begins to decrease rapidly above 6 kHz, yet, if the audio is to sound as if it has not been filtered, the instantaneous bandwidth of the lowpass filter must exceed 15 kHz when significant high-frequency program energy exists. Therefore, the added non-linear element causes the system to provide a substantially brighter and less-processed sound, without compromising its ability to prevent audible noise modulation.

A further novel aspect of the invention is that the control voltage for the lowpass filter 80 in the noise reduction system is coupled into the spectral restoration system. Whenever the noise reduction system is actively reducing noise, it limits the maximum high-frequency boost permitted in the spectral restoration system. This prevents audible noise modulation.

Spectral restoration is effected by passing the output of a 6 dB/octave highpass filters 120 through a voltage-controlled amplifier (VCA) 170 and thence through a variable spectral restoration control 150. The output of the system is a mixture of the output of the spectral restoration control 150 with the system's input (both signals are coupled to summer 95). The high-frequency energy in this mixture consists not only of the output of the VCA 170, but also of high frequency energy originally present in the input. The amount of spectral restoration is determined by the gain of the VCA as scaled by the gain of the user-adjustable spectral restoration control 150.

Another novel aspect of the invention is the means by which the gain of VCA 170 (and thus the amount of spectral restoration) is automatically determined. This gain is determined by a comparator 240, which compares the peak level of the input signal (as passed through a band-pass filter 105) to a weighted sum of the input and output of VCA 170. This novel combination of feed-forward and feedback control causes the relative amount of spectral restoration to stay constant over a wide range of input levels.

The feed-forward component from the input of the VCA 170 represents the high frequency energy originally present in the input; it permits the control loop to "anticipate" the overall proportion of high-frequency energy in the output mix without being physically connected to the mixed output.

BRIEF DESCRIPTION OF THE DRAWINGS

FIG. 1 is a block diagram of the present invention; it generally comprises a program-controlled lowpass filter (of the noise reduction system) in series with a spectral restoration circuit.

FIG. 2 is a schematic diagram of the non-linear breakpoint system of FIG. 1.

FIG. 3 is a schematic diagram of the voltage-controlled shelving lowpass filter 80 of FIG. 1.

DETAILED DESCRIPTION OF THE INVENTION

An audio signal processing apparatus is disclosed which comprises a dynamic noise reduction system and spectral reduction system. In the following description, numerous specific details are set forth such as specific part numbers, frequencies and component values. It will be obvious to one skilled in the art that the present invention may be practiced without these specific details. In other instances, well-known circuits are shown in block diagram in order not to unnecessarily obscure the present invention in detail.

CURRENTLY PREFERRED EMBODIMENT

Referring to FIG. 1 the unprocessed audio input signal enters on line 10 and is applied to a control sidechain and lowpass filter 80. The bandwidth (in octaves) of filter 80 is directly proportional to the control signal on line 70.

The sidechain begins with highpass filter 20. This is a third-order Butterworth filter with a −3 dB frequency of approximately 5 kHz. The output of filter 20 (line 30) is applied to a full-wave precision rectifier 40, and thence to a logarithmic converter 44 via line 42. The output of log converter 44 (line 50) is applied to a timing circuit 60. Circuit 60 is a semi-peak detector with an attack time of approximately 3 milliseconds and a recovery time of approximately 50 milliseconds. The semi-peak detector is buffered with an operational amplifier (opamp), which provides a thresholding function. The filter threshold control 55 determines the level on line 50 which initially causes the control signal on line 63 to move from its quiescent value, thus causing the bandwidth of lowpass filter 80 to begin to increase in response to high-frequency program content in the signal on line 10. (Control 55 may be set manually based on the audible noise level in the output signal.) Circuits 40, 44, and 60, as well as the voltage-controlled amplifier (VCA) within filter 80, are Part No. SSM2120, manufactured by Precision Monolithics, Inc. in the currently preferred embodiment.

The output of the timing circuit 60 (line 63) is a bandwidth-control signal for lowpass filter 80. This signal is modified by non-linear breakpoint circuit 66 prior to its application to filter 80 on line 70. The incremental gain of circuit 66 changes at an input signal level corresponding to a filter 80 bandwidth of 6 kHz, becoming four times larger when the input signal exceeds this breakpoint. In essence, this modifies the control law of filter 80 as seen on line 63: if the bandwidth of the filter changes by 1 octave per volt below 6 kHz, it changes at 4 octaves per volt above 6 kHz.

The effect of breakpoint circuit 66 is that once sufficient energy is detected at the output of filter 20 to increase filter 80's bandwidth to 6 kHz, only a very slight increase in energy at the output of filter 20 is required to further increase filter 80's bandwidth to the full audible bandwidth of 20 kHz. This novel aspect of the invention maximizes preceived bandwidth at the output of filter 80. Yet, because more incremental high frequency energy on line 10 is required to increase filter 80's bandwidth from 1 kHz (its quiescent value) to 6 kHz than to increase it from 6 kHz to beyond audibility, the tendency of the circuit to produce audible noise modulation is minimized, because the ear is most sensitive to noise in the frequency range from 1 kHz to 6 kHz.

The output of filter 80 (line 90) is applied to the spectral restoration system. The spectral restoration system has a sidechain with two parallel branches. The first branch includes band-pass filter 105 (output line 110) and peak detector 115 (output line 130). Band-pass filter 105 has an approximate bandwidth of 400 Hz to 6 kHz in the currently preferred embodiment, and is designed to very roughly approximate the equal-loudness sensitivity contour of the human ear at 70 phon. The signal on line 110 is thus an estimate of human perception of the loudness of the signal on line 90. Upon summation with a small constant bias 134 in summer 132 (explained below), the output of peak detector 115 (line 130) is applied to the "+" input of comparator 240 (which may be an ordinary integrated-circuit comparator such as part number LM339 manufactured by National Semiconductor).

The "−" input of comparator 240 is fed from the output of the second sidechain branch (line 185). This branch receives the signal on line 90 at highpass filter 120. This is a 6 dB/octave filter with a −3 dB frequency of 1.5 kHz. The output of filter 120 (line 165) is applied to the input of VCA 170. VCA 170 has a linear decibel-per-volt control law (sometimes called "decilinear"). The output of VCA 170 (line 172) is summed with its input in summer 175. The output of summer 175 (line 177) is applied to highpass filter 180. This is a 6 dB/octave filter with a −3 dB frequency of approximately 10 kHz. Filter 180 weights the signal on line 185 to emphasize the higher audio frequencies.

The outputs of the two branches of the sidechain (lines 136 and 185) are applied to comparator 240, as mentioned. The output of comparator 240 (line 235) is a unipolar signal which is applied to attack and release timing circuit 230. The attack and release times of this circuit are both approximately 50 milliseconds in the currently preferred embodiment.

The output of timing circuit 230 (line 220) is a DC control signal. This signal is summed (in summer 210) with the control signal on line 70 from the noise reduction system.

This sum signal on line 190 is applied to the gain-control port of VCA 170. This closes a feedback loop consisting of VCA 170, summer 175, highpass filter 180, comparator 240, timing circuit 230, and summer 210. Ignoring for the moment the signal on line 70, this feedback circuit operates as follows. The signal on line 136 is a DC signal proportional to the loudness of the input signal (line 10). This loudness signal acts as a reference for comparator 240. If the signal level on line 185 exceeds the signal level on line 136, comparator 240 will turn on, causing the gain of VCA 170 to decrease until the signal level on line 185 no longer exceeds the signal level on line 136. Conversely, if the signal level on line 185 is below the signal level on line 136, the timing circuit 230 will cause the gain of VCA to increase until the level on line 185 is approximately the same as the level on line 136. Thus feedback attempts to hold the level on line 185 equal to the level on line 136 at all times.

The signal on line 160 (output of summer 95) is the sum of the noise-reduced but otherwise unprocessed signal on line 90, plus the spectral restoration signal on line 150 as adjusted by spectral restoration control 140. The signal on line 185 is approximately proportional to the high-frequency content of the signal on line 160.

Thus the feedback circuit forces the high-frequency content on line 160 to have a fixed ratio (as determined by the setting of the spectral restoration control 140) when compared to the loudness of the signal on line 90. If the signal on line 90 has little high-frequency content, VCA 170 will have high gain and will add substantial energy from the output of highpass filter 120 into the output signal on line 160. Conversely, if the signal on line 90 has a large amount of high-frequency content, VCA 170 will have low gain and will add very little high-frequency energy into the output signal. It is undesirable to cause as much high-frequency boost when signal levels are low as when they are high, because when signal levels are low, boosting high frequencies will also tend to audibly boost noise.

The signal on line 70 is a bandwidth control signal for the noise reduction system, and represents the amount of noise reduction that the system must do. This signal is added to the VCA control signal on line 220. The signal on line 70 thus reduces the gain of VCA 170 and therefore the amount of high frequency boost whenever the noise reduction system is actively reducing the bandwidth of filter 80 to reduce noise. This prevents the spectral restoration system from causing noise modulation by excessively increasing high-frequency boost when noise is likely to be audible.

There are two other ways by which the spectral restoration system prevents excessive build-up of noise. First, when the signal level is very low, the signal on line 90 will consist mostly of noise. Noise has a spectrum that is heavily weighted towards high frequencies by comparison to most program material. The spectral restoration system will thus conclude that the noise already has enough high-frequency content, and will force the gain of VCA 170 to a low value to prevent excessive boost, as it would with any program material having the same characteristics. Second, a DC bias signal from bias source 134 is added in summer 132 to the output of peak detector 115 to force the reference voltage on line 136 "below zero" during silence or very low-level program material. The feedback circuit then attempts to remove all signal on line 185 by forcing the gain of VCA 170 to be as low as possible. Thus, during silence and very low-level material, no high-frequency boost can occur, and noise is not increased.

CURRENTLY PREFERRED EMBODIMENT OF THE BREAKPOINT CIRCUIT 66

FIG. 2 is a schematic diagram of the non-linear breakpoint circuit 66. The output of this circuit (line 70) provides a control signal which is used to control a voltage controlled amplifier 312 found within the lowpass filter 80. The input to the circuit is the output of the timing circuit 60 (line 63). The input is coupled through a resistor 300 and resistor 310 to line 70. The series combination of resistor 305 and diode 320 couple the node between resistors 300 and 310 to ground. Resistor 315 is coupled between line 70 and ground.

In understanding this circuit, note that a negative going control signal on line 70 corresponds to decreasing the bandwidth of filter 80, and a control voltage of zero volts represents the maximum filter bandwidth (40 kHz).

When the control voltage on line 63 becomes sufficiently negative to force the bandwidth of filter 80 to 6 kHz, the voltage across diode 320 is approximately 0.6 V, and diode 320 starts to conduct. When it does so, it shunts current away from resistors 310 and 315, reducing the overall gain. The circuit's gain (input (on line 63) to its output (on line 70)) is reduced to ¼ of the value it has when diode 320 is non-conductive. Thus the circuit provides the requisite non-linear characteristic.

CURRENTLY PREFERRED EMBODIMENT OF THE LOWPASS FILTER 80

FIG. 3 shows a schematic diagram of the voltage-controlled shelving lowpass filter 80. The heart of the circuit is an integrator with voltage-controlled gain, VCA 312 cascaded with opamp 355 and capacitor 360. (This circuit is well-known in the art, however, not for this application.)

The output of the opamp 355 is coupled through resistor 330 to the negative input terminal of the opamp 335. The output of opamp of 335 provides the output signal on line 90. Feedback is provided between the output and input of opamp 335 through resistor 340. The output of opamp 335 is also coupled to the input of the VCA 312 through resistor 345. The input signal on line 10 is coupled to the negative input terminal of opamp 335 through the resistor 325.

Resistors 325, 330, 340, 345, and 350 cooperate with opamp 335 to create a combination of feedforward and feedback around the voltage-controlled integrator. A straightforward nodal analysis of the entire circuit in FIG. 3 shows that its s-plane transfer function has a simple pole of transmission and a simple zero of transmission. The pole frequency divided by the zero frequency is 0.355, providing a 9 dB shelving filter with a predominantly lowpass characteristic. The pole and zero frequencies are tuned simultaneously by varying the gain of VCA 320.

This particular circuit is believed to be novel, although there are other ways to achieve the same voltage-tunable transfer function.

Thus, a novel dynamic noise reducing and spectral restoration system has been described.

I claim:

1. A dynamic audio noise reduction and spectral restoration system comprising:
   a noise reduction circuit which is coupled to receive an input audio signal;
   a spectral restoration circuit coupled to receive the output of said noise reduction circuit and which provides an output audio signal for said system;
   said noise reduction circuit including a lowpass filter, the bandwidth of which is controlled by a control signal developed in a sidechain, said sidechain receiving said input audio signal as an input and including a breakpoint circuit for providing a breakpoint in said control signal such that said bandwidth of said lowpass filter increases much more rapidly above a breakpoint frequency when compared to increases in said bandwidth below said breakpoint frequency.

2. The system defined by claim 1 wherein said breakpoint frequency is approximately 6 kHz.

3. The system defined by claim 1 wherein said spectral restoration circuit includes means for providing an increase in high frequency content in said output audio signal, said spectral restoration circuit being coupled to receive said control signal to reduce the amount of said increase in said high frequency content as said control signal reduces said bandwidth of said lowpass filter.

4. The system defined by claim 1 wherein said lowpass filter comprises a voltage controlled amplifier cascaded with an operational amplifier and a capacitor, with said voltage controlled amplifier and capacitor performing an integration function.

5. The system defined by claim 4 wherein said lowpass filter also includes a plurality of resistors connected to and cooperating with said operational amplifier to provide a feedforward and feedback path around said voltage control integrator.

6. The system defined by claim 5 wherein said lowpass filter has an s-plane transfer function with a simple pole of transmission and a simple zero of transmission.

7. A dynamic audio noise reduction and spectral restoration system comprising:
  a noise reduction circuit coupled to receive an input audio signal; and
  a spectral restoration circuit coupled to receive the output of said noise reduction circuit, for providing an output audio signal comprising:
  a highpass filter coupled to receive said output of said noise reduction circuit;
  a voltage controlled amplifier coupled to receive said output of said highpass filter;
  a feedback loop coupled to the output of said voltage controlled amplifier for providing a control signal for said voltage controlled amplifier;
  a variable spectral restoration control coupled to said output of said voltage controlled amplifier said control providing a signal which is summed with said output of said noise reduction circuit to provide said output audio signal.

8. The system defined by claim 7 wherein said feedback loop includes a feedforward path coupled to the input of said voltage control amplifier and to a summer, which summer is coupled to said output of said voltage controlled amplifier.

9. The system defined by claim 8 wherein said feedback loop also includes a comparator for comparing a signal representing peak levels of said output of said noise reduction circuit and the output of said summer.

10. The system defined by claim 9 including biasing means for biasing said signal representing peak levels to reduce high frequency boosting to a minimum, thereby preventing amplification of low-level noise.

11. A dynamic audio noise reduction and spectral restoration system comprising:
  a noise reduction circuit coupled to receive an input audio signal;
  a spectral restoration circuit coupled to receive the output of said noise reduction circuit for providing an output audio signal with boosted high frequency content, said restoration circuit including (i) means for detecting peak levels in said output of said noise reduction circuit, and (ii) biasing means for reducing said high frequency boosting to a minimum when said peak levels drop below a predetermined level.

* * * * *